United States Patent [19]

Ozawa

[11] Patent Number: 4,467,345

[45] Date of Patent: Aug. 21, 1984

[54] SEMICONDUCTOR INTEGRATED CIRCUIT DEVICE

[75] Inventor: Masahide Ozawa, Tokyo, Japan

[73] Assignee: Nippon Electric Co., Ltd., Tokyo, Japan

[21] Appl. No.: 311,805

[22] Filed: Oct. 15, 1981

[30] Foreign Application Priority Data

Oct. 23, 1980 [JP] Japan ................................ 55-148770

[51] Int. Cl.$^3$ ..................... H01L 23/48; H01L 29/44; H01L 29/34; H01L 29/52
[52] U.S. Cl. ........................................ 357/68; 357/54; 357/65; 357/69
[58] Field of Search ....................... 357/68, 54, 69, 65

[56] References Cited

U.S. PATENT DOCUMENTS

| | | | |
|---|---|---|---|
| 3,620,837 | 11/1971 | Leff et al. | 357/65 |
| 3,632,433 | 1/1972 | Tokuyama et al. | 357/54 |
| 3,822,467 | 7/1974 | Symersky | 357/68 |
| 4,109,275 | 8/1978 | Sarkary | 357/68 |
| 4,223,337 | 9/1980 | Kojima et al. | 357/68 |

Primary Examiner—Martin H. Edlow
Assistant Examiner—Jerome Jackson
Attorney, Agent, or Firm—Sughrue, Mion, Zinn, Macpeak, and Seas

[57] ABSTRACT

A semiconductor integrated circuit device is disclosed in which insulation faults occurring above the ground or power supply wiring are eliminated. In one embodiment of the invention, the ground or power supply wirings are divided into two or more substantially parallel wiring sections, which eliminates the surface upon which large grain size phosphorus silicate glass may form. In a second embodiment of the invention, the ground or power supply wirings are divided into two or more substantially parallel wiring sections in the vicinity of the exposed region of a bonding pad.

8 Claims, 7 Drawing Figures

SEMICONDUCTOR INTEGRATED CIRCUIT DEVICE

BACKGROUND OF THE INVENTION

The present invention relates to a semiconductor integrated circuit device, and more particularly to a semiconductor integrated circuit device having a device-protecting insulating film of 1.0 μm or more in thickness on a device.

The progress in insulated gate field effect transistor integrated circuits (hereinafter called MOS IC) towards the realization of a high degree of circuit integration and high operation speed has been remarkable, and these operation speeds are gradually approaching the range of bipolar IC's.

Generally in a MOS IC, operational speed is largely governed by channel lengths L and dissipated currents of individual MOS transistors forming the integrated circuit, and as the lengths L are shorter and the operation currents are larger, it becomes operable at a higher speed. This implies that upon design and manufacture of a MOS IC operable at a high speed, a finer pattern should be formed, and ground or power supply wirings having larger current capacities, that is, ground or power supply wirings having broad widths, are necessitated.

In the case where an IC is constructed of MOS transistors having short channel lengths (4 μm or less) for the purposes of realizing high speed and large-scale integration, it was discovered that in addition to the fact that a slight error in patterning would result in variations of characteristics, the reliability of the device, as compared to that of a transistor having a longer channel length L (5 μm or more), is extremely sensitive to minute amounts of contamination ions.

Variations in characteristics caused by external contamination also arise in the process of assembling a MOS IC. The mechanism by which these variations in characteristics occur can be explained in the following manner.

Among the materials generally used for assembly are low-melting-point glass and plastics. Since these materials consist of various compounds, they are of high impurity as compared to the materials used in a diffusion manufacturing process of a MOS IC chip, and thus contain contamination substances which cause variations in characteristics. On the other hand, it is a common practice to provide an insulating film over the surface of an integrated circuit device for the purpose of protecting the device from contamination as well as from undesirable mechanical forces. However, in the event that this insulating film consists of a silicon dioxide (SiO$_2$) film of about 0.5~1 μm in thickness, if a contamination substance should be deposited onto the surface of such an insulating film, during the heat treatment in the assembly process, heavy ions emanating from the contamination substance diffuse through the insulating film and reach the gate region of the MOS transistor, resulting in variations in the threshold voltage, and attendant unacceptable characteristics in the MOS IC. In a MOS IC which has become unacceptable due to the above-mentioned cause, since the contamination ions move at a high temperature, the environmental condition of use will determine the extent of threshold voltage variations, thereby lowering the overall reliability of the device.

With regard to a method for obviating the problem in reliability caused by the above-described mechanism, it has been discovered that if phospho-silicate glass of several mol% in concentration is used as an insulator for protecting the device, and the thickness of the insulating film is selected to be 1 μm or more, the resulting insulating film will protect the device from the contamination ions. This is caused by the fact that since the phosphorus contained in phospho-silicate glass serves as a getter for the contamination ions applied externally, the contamination ions are not mobile under the subsequent influence of heat or an electric field. In other words, if a phospho-silicate glass film of 1 μm or more in thickness is used as a protective film, the resulting MOS IC will have a high reliability against external contamination. However, phospho-silicate glass has an extremely large grain size when it is grown on wiring metals such as on aluminum (Al) or aluminum-silicon alloy, and if the surface of the metal is large, the stress between grains will also become unacceptably high. If the film thickness becomes 1~1.5 μm or more, cracks or faults are generated in the phospho-silicate glass or silicon dioxide film. These faults do not occur when the width of a metallic wiring is narrow, but they are generated on a broad wiring such as a ground or power supply wiring. Moreover, in the contemplated MOS IC operable at a high speed, since the current capacity is to be great due to the large operating current requirements as described previously, a power supply or ground wiring having such a broad width is necessitated, thereby enhancing the possibility of incurring such faults.

The ground or power supply wiring layer extends from the bonding pad to about 50~250 μm distance in the broad width state, and separates to narrower width wiring layers for connecting to the circuit elements such as MOS transistors. The above-described faulting problem occurs in the area between the bonding pad and a point remoted from the bonding pad of about 50~250 μm.

SUMMARY OF THE INVENTION

It is an object of the present invention to provide an effective semiconductor integrated circuit device in which the above-mentioned shortcomings of the prior art are eliminated.

It is another object of the present invention to provide an effective semiconductor integrated circuit device having high reliability, a high operational speed, and a high degree of circuit integration. The present invention employs a phospho-silicate glass film of 1 μm or more in thickness as a device-protecting insulating film, in which faults are prevented by dividing the ground or power supply wirings into two or more narrow wirings. This eliminates the surface on which large grain size phospho-silicate glass forms, while maintaining the greater wiring widths needed for high speed MOS IC operation.

According to one embodiment of the present invention, a semiconductor integrated circuit device comprises a semiconductor substrate; an insulation layer, formed onto said semiconductor substrate; a metallic wiring layer formed onto the insulator layer for providing a power supply or a ground potential to the circuit elements in the chip, which is divided into at least two substantially parallel wiring sections; and a protecting insulation film of 1 μm or more in thickness formed onto said wiring sections.

According to another embodiment of the present invention, a semiconductor integrated circuit device comprises a semiconductor substrate; an insulation layer, formed onto said semiconductor substrate; a bonding pad formed onto said insulation layer; a metallic electrode wiring layer for providing a power supply or a ground potential formed onto said insulation layer and extending inwardly from said bonding pad; and a protecting insulation film covering said wiring layer, disposed such that an effective area of said bonding pad is exposed, said wiring layer being divided in the vicinity of said exposed area of said bonding pad into at least two substantially parallel wiring layer sections.

The protecting insulation film may be made of either phospho-silicate glass or silicon dioxide of 1 μm or more thickness. Generally, aluminum or aluminum-silicon alloy can be used in the metallic electrode layer. The widths of the wiring sections are preferably not more than 50 μm, and the distance between the exposed area of the bonding pad and the divided portion of the wiring layer is also preferably not more than 50 μm.

DESCRIPTION OF THE PREFERRED EMBODIMENTS

Figure 1:
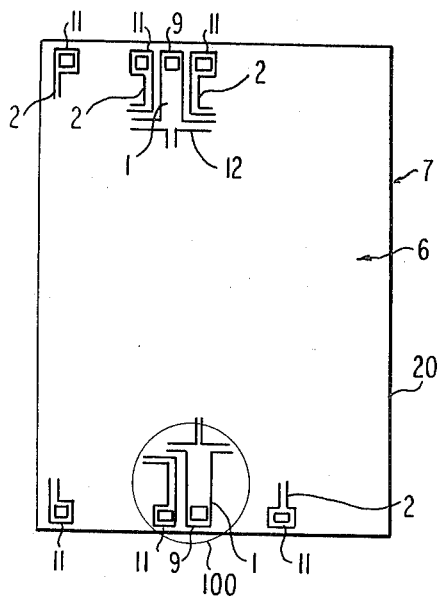
FIG. 1 is a planar view showing a semiconductor integrated circuit device according to a prior art technique.
Figure 2A:
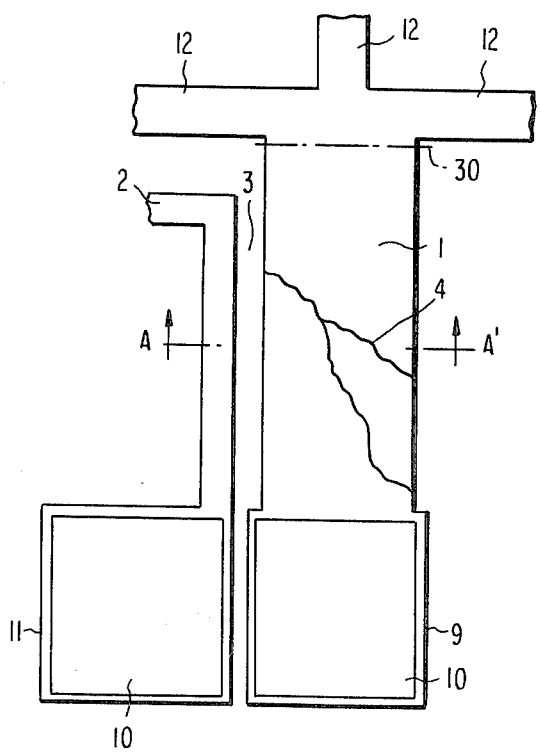
FIG. 2A is a planar view showing a encircled portion 100 in FIG. 1 in an enlarged scale.
Figure 2B:
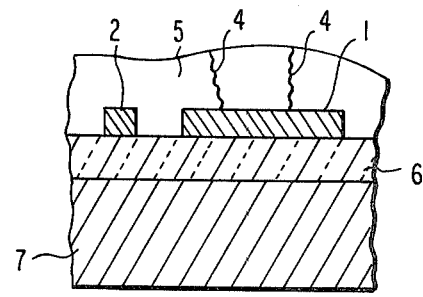
FIG. 2B is a cross-sectional view taken along line A—A' in FIG. 2A as viewed in the direction of the arrows.

FIGS. 1, 2A and 2B show a semiconductor integrated circuit device (chip) 20 constructed according to the methods in the prior art, in which an insulation layer 6 such as silicon dioxide is formed onto a semiconductor substrate 7, and both a plurality of bonding pads 11 for input or output signal wiring layers 2 of aluminum and twin bonding pads 9 for grounding or power supply wiring layer 1, of aluminum are formed onto insulation layer 6 so as to locate at a peripheral portion of the substrate. Each wiring layer 2 extends inwardly to connect to each circuit element (not shown), including the MOS transistor, provided in the chip. A broad wiring layer 1 of 90 μm in width for grounding or power supply extends from the bonding pad 9 to a separating point 30 which is about 50~250 μm away from the bonding pad 9. At the separating point 30, the broad wiring layer 1 is separated into narrower wiring layers 12, to connect to circuit element (not shown) including MOS transistors provided in the chip. In FIG. 2B, a protecting insulation film of phospho-silicate glass 5 covers the wiring layers, the insulating layer 6 and the circuit elements, but does not cover an effective area 10 of about 100 μm square of the bonding pads 9 and 11 as seen in FIG. 2A. On the broad metallic wiring layer 1, the grain size of the phosphorus silicate glass 5 becomes larger than that on the narrower metallic wirings and the resulting grain stresses are such that if the protecting insulation film is of 1~1.5 μm or more in thickness, as seen in FIGS. 2A and 2B, faults 4 develop which give rise to the afore-mentioned reliability problems.

Figure 5:
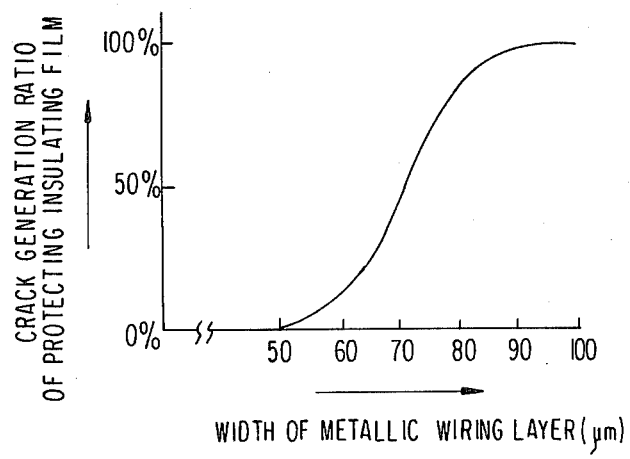
FIG. 5 is a graph showing an experimental data of the fault generation ratio of a protecting insulating film as a function of width of the metallic wiring layer.

Accordingly, an examination was made into the relationship between the width of the aluminum metallic wiring layer and the fault generation ratio of phosphosilicate glass of 1.5 μm in thickness. The results of such an examination, as shown in FIG. 5, teach that a metallic wiring layer such as of aluminum or aluminum-silicon alloy, when maintained at a width of 50 μm or less, will not produce any faults in the phospho-silicate glass protecting insulation layer grown above it.

Figure 3:
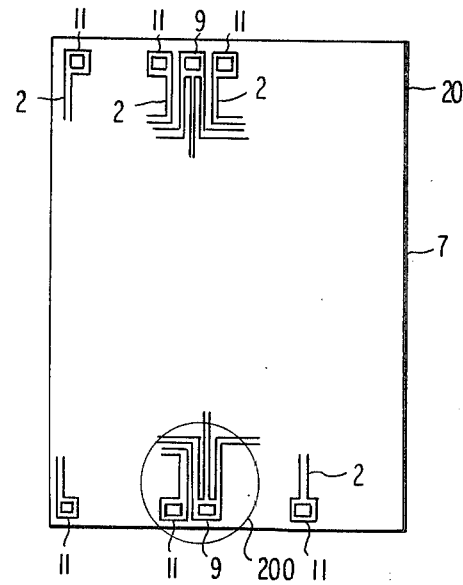
FIG. 3 is a planar view showing a preferred embodiment of the present invention.
Figure 4A:
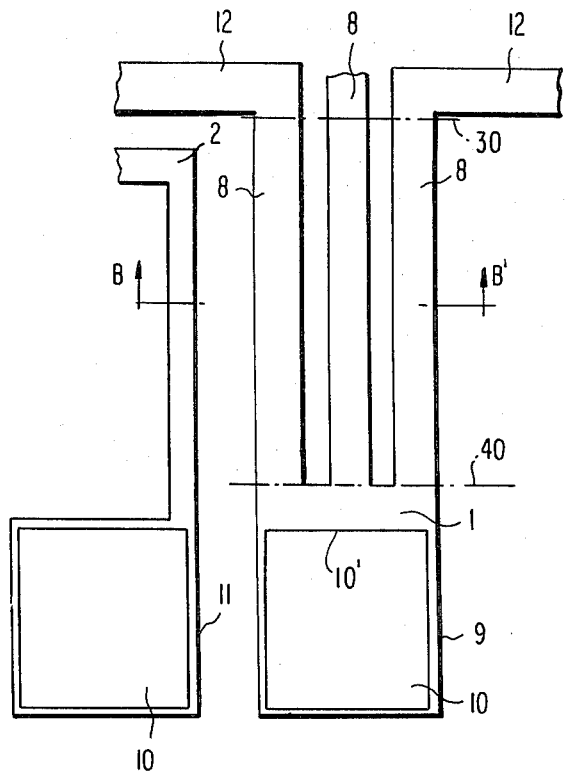
FIG. 4A is a planar view showing a encircled portion 200 in FIG. 3 in an enlarged scale.
Figure 4B:
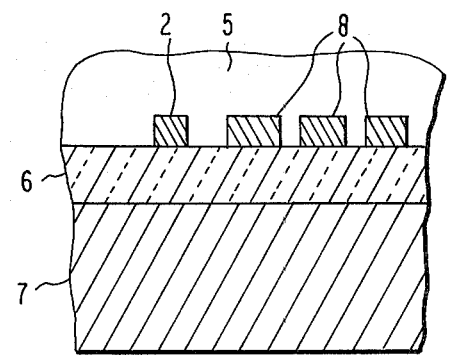
FIG. 4B is a cross-sectional view taken along line B—B' in FIG. 4A as viewed in the direction of arrows.

FIGS. 3, 4A and 4B show one preferred embodiment of the present invention. In these Figs., component parts are enumerated as they were in FIGS. 1, 2A and 2B. The broad aluminum wiring layer 1 of 90 μm in width for grounding or power supply is divided at dividing position 40 into three narrower wiring layer sections 8 of aluminum. The divided position is 50 μm or less away from the edge 10' of the exposed bonding area 10. Each of the divided wiring sections is of 30 μm in width, and extend in parallel, with a distance between them of 10 μm to the separating point 30 50~200 μm away from the dividing position 40.

Since the wiring layer of large current capacity is divided into narrower wiring layers 8, even if phosphosilicate glass 5 is grown on the metallic wiring layer up to a thickness of 1 μm or more, the stresses between the grains are not sufficient to generate faults 4.

In accordance with the present invention, a MOS IC having a high operation speed and a high degree of circuit integration can be manufactured with a high degree of reliability not heretofore possible.

What is claimed is:

1. A semiconductor integrated circuit device comprising a semiconductor substrate; an insulation layer, formed onto said semiconductor substrate; a bonding pad, formed onto said insulation layer; a metallic electrode wiring layer providing a power supply line or ground potential line formed onto said insulation layer and extending from said bonding pad; and a protecting insulation film covering said wiring layer, disposed such that an area of said bonding pad is exposed, said wiring layer being divided at a position less than 50 μm from said exposed area of said bonding pad into at least two wiring layer sections, said wiring layer sections being extended in the same direction substantially in parallel to each other and bent by different angles at a predetermined distance from the divided position to further extend in different directions.

2. The semiconductor integrated circuit device of claim 1, in which said protecting insulation film is made of phospho-silicate glass and has a thickness of at least 1 μm.

3. The semiconductor integrated circuit device of claim 1, in which said protecting insulation film is made of silicon dioxide and has a thickness of at least 1 μm.

4. The semiconductor integrated circuit device of claim 1, in which said metallic electrode layer is made of aluminum.

5. The semiconductor integrated circuit device of claim 1, in which said metallic electrode layer is made of aluminum-silicon alloy.

6. The semiconductor integrated circuit device of claim 1, wherein the width of each of said divided wiring sections is not more than 50 μm.

7. The semiconductor integrated circuit of claim 1, wherein said wiring layer sections diverge from their parallel course at said predetermined distance from the divided position, ranging from 50 μm to 200 μm.

8. A semiconductor integrated circuit device comprising a semiconductor substrate having circuit elements, an insulation layer formed onto said semiconductor substrate, a plurality of first and second bonding pads located at a periphery of said substrate and formed on said insulation layer, input and output signal wiring layers having a first width connected to respective ones of said first bonding pads and extending respectively on said insulation layer towards associated ones of said circuit elements, a group of reference voltage wiring layers having a second width, for supplying a power or a ground potential to predetermined circuit elements, formed on said insulation layer and connected at one end to a wider wiring layer having a third width, said wider wiring layer being connected to a respective one of said second bonding pads, and a protecting insulation film covering said signal wiring layers, said reference voltage wiring layers, said wider wiring layers, and peripheral portions of said first and second bonding pads so as to expose the respective center portions of said bonding pads, said second width being 50 μm or less, said third width being larger than said second width, said wider wiring layer having a length of 50 μm or less, said group of reference voltage wiring layers running substantially in parallel with each other near said one end thereof and diverging from their parallel course at a distance from said one end thereof, said distance ranging from 50 μm to 200 μm, so that said reference voltage wiring layers extend to the associated circuit elements.

* * * * *